United States Patent [19]

Seki

[11] 4,265,685

[45] May 5, 1981

[54] UTILIZING SIMULTANEOUS MASKING AND DIFFUSION OF PERIPHERAL SUBSTRATE AREAS

[75] Inventor: Masatoshi Seki, Tachikawa, Japan

[73] Assignee: Hitachi, Ltd., Tokyo, Japan

[21] Appl. No.: 98,140

[22] Filed: Nov. 28, 1979

[30] Foreign Application Priority Data

Jan. 26, 1979 [JP] Japan ................................. 54-7109

[51] Int. Cl.³ ...................... H01L 21/20; H01L 21/22
[52] U.S. Cl. ....................................... 148/174; 29/571;
29/577 R; 148/1.5; 148/175; 148/187; 156/653;
156/657; 357/23; 357/41; 357/51; 357/59;
427/85; 427/86
[58] Field of Search ................ 148/1.5, 174, 175, 187;
29/571, 577, 578, 580; 156/653, 657; 357/23,
41, 51, 59; 427/85, 86

[56] References Cited

U.S. PATENT DOCUMENTS

| | | | |
|---|---|---|---|
| 3,911,471 | 10/1975 | Kooi et al. | 148/175 X |
| 4,013,489 | 3/1977 | Oldham | 148/174 |
| 4,055,444 | 10/1977 | Rao | 148/187 X |
| 4,070,748 | 1/1978 | Legat et al. | 29/580 X |
| 4,080,718 | 3/1978 | Richman | 29/571 |
| 4,081,896 | 4/1978 | Dingwall | 29/590 |
| 4,110,776 | 8/1978 | Rao et al. | 357/59 X |
| 4,139,786 | 2/1979 | Raymond et al. | 357/59 X |
| 4,148,055 | 4/1979 | Edlinger et al. | 357/55 X |
| 4,187,602 | 2/1980 | McElroy | 29/571 |

FOREIGN PATENT DOCUMENTS

2750209 6/1978 Fed. Rep. of Germany.
2814695 10/1978 Fed. Rep. of Germany.

OTHER PUBLICATIONS

Kooi, "Local Oxidation of Silicon" Philips Res. Repts, vol. 26, No. 3, pp. 157-165, Jun., 1971.

*Primary Examiner*—R. Dean
*Assistant Examiner*—W. G. Saba
*Attorney, Agent, or Firm*—Craig & Antonelli

[57] ABSTRACT

The present invention deals with a method of taking out a substrate electrode of a LOCOS-type silicon gate MOSIC device from the surface of the semiconductor substrate. According to the present invention, a masking layer for preventing the introduction of impurities is formed on the periphery of the semiconductor substrate simultaneously with the masking step for forming a resistor of polycrystalline silicon, the mask is removed after the impurities have been introduced, and a substrate electrode is formed on the exposed surface of the semiconductor substrate.

5 Claims, 7 Drawing Figures

UTILIZING SIMULTANEOUS MASKING AND DIFFUSION OF PERIPHERAL SUBSTRATE AREAS

BACKGROUND OF THE INVENTION

The present invention relates to a method of forming substrate electrodes of MOSIC (Metal-Oxide-Semiconductor Integrated Circuit), and particularly to a method of forming substrate electrodes through steps of a number as small as possible.

A silicon gate-type MOSIC having a thick oxide film which is selectively formed on a silicon semiconductor substrate except the regions where elements are to be formed, and having an interconnection formed on the thick oxide film, has been widely known as disclosed, for example, in "Philips Research Reports, Vol. 26, No. 3, pp. 157–165, June 1971". The so-called LOCOS (Local Oxidation of Silicon) type of MOSIC minimizes the stray capacitance in the wiring layer, enables the switching speed to be increased, and is advantageous for use with memory circuits.

With reference to the LOCOS-type silicon-gate MOSIC, a memory which employs polycrystalline silicon resistors as load resistances of transistors which constitute a memory cell, has been known as disclosed, for example, in U.S. Pat. No. 4,110,776 (Aug. 29, 1978). Since high reliability is required for the memory, the MOSIC must be packaged in the form of a ceramic package or a glass package instead of a resin mold package.

When a MOSIC device having electrodes on the back surface of the semiconductor substrate is to be sealed by packaging with ceramic material or glass, outgoing lead wires of the package and substrate electrodes must be connected by wires. With the electrodes being located on the back surface of the semiconductor substrate, however, it is very difficult to bond the wires between the substrate and the outgoing lead wires, and the technique of automatic wire bonding is not applicable.

To employ the ceramic packaging or glass packaging, therefore, it is necessary to provide a substrate electrode on the surface of the semiconductor substrate like other electrodes (bonding pads).

In particular, in dealing with the silicon gate MOSIC of the LOCOS-type, when the substrate electrode is to be installed on the surface of the semiconductor substrate like other electrodes, the source and drain are formed by introducing impurities of a conductivity type opposite to that of the substrate into the surface of the substrate except the areas of the semiconductor substrate covered with a pattern of thick silicon oxide (field oxide) and a pattern of silicon gate electrode. Therefore, after the impurities have been introduced, a portion of the pattern of the thick silicon oxide may be subjected to the etching to expose the substrate, thereby to form a substrate electrode on the exposed surface of the substrate.

To remove such a thick silicon oxide layer, however, a particular etching step is required which causes the yield to be decreased.

SUMMARY OF THE INVENTION

The object of the present invention therefore is to provide a method of forming substrate electrodes of MOSIC through a relatively simple processing, the substrate electrodes being taken out from the surface of the semiconductor substrate.

According to the method of the present invention, the feature resides in the use of an insulating film formed by the vapor deposition during the formation of polycrystalline silicon resistance as a mask for forming the substrate electrode.

The invention is illustrated below with reference to the accompanying drawings.

DESCRIPTION OF THE PREFERRED EMBODIMENTS

FIGS. 1a to 1e illustrate processes for producing the LOCOS-type silicon gate MOSIC according to an embodiment of the present invention. FIGS. 1a to 1e are cross-sectional views illustrating a portion of a memory (which is formed on a pellet) among many memories which are formed at one time on a piece of a silicon wafer. The individual processes are mentioned below.

Figure 1A:
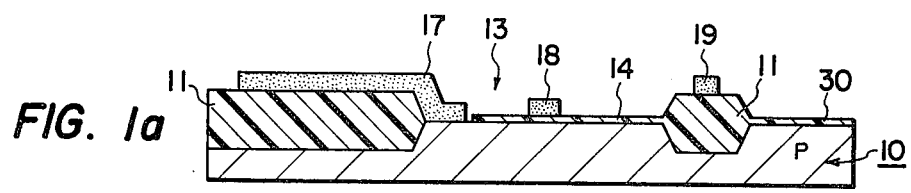
FIGS. 1a to 1e are cross-sectional views of the process for illustrating the method of forming substrate electrodes in accordance with the present invention.
Figure 1B:
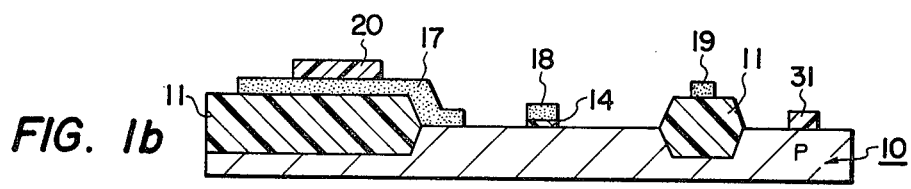
Figure 1C:
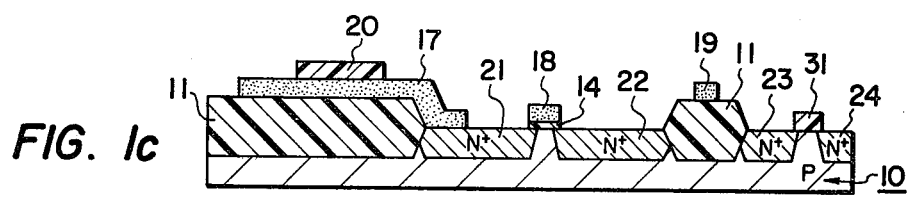
Figure 1D:
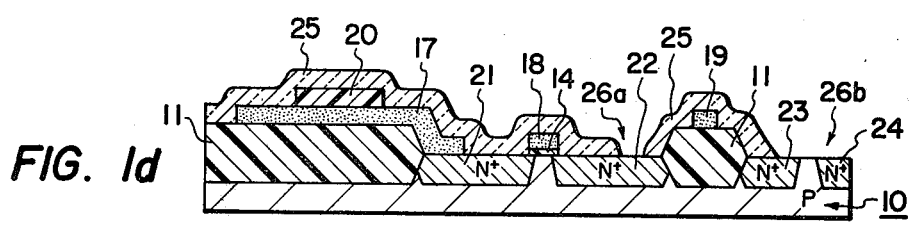
Figure 1E:
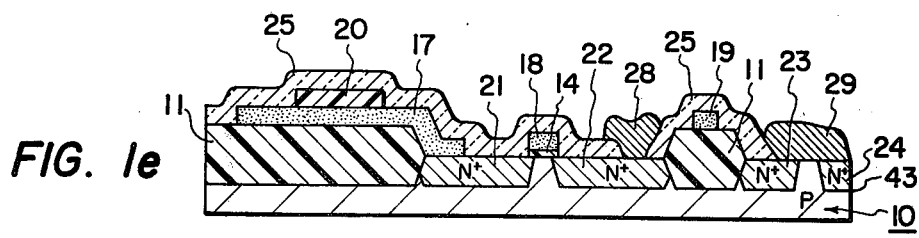

(a) Referring to FIG. 1a, the surface of a semiconductor substrate 10 made of P-type silicon is oxidized by a conventional selective oxidation method to form a pattern of a field silicon oxide film 11 having a thickness of as large as, for example, 1 $\mu$m. An opening 13 is formed in the oxide film 11 such that active regions for memory cells inclusive of MOSFET (insulated gate field effect transistor) can be formed therein. The silicon oxide film 11 is formed in an annular shape so as to surround the active region 13. The semiconductor substrate is then subjected again to the oxidation treatment, whereby a silicon oxide film 14 having a thickness as small as about 450 Å is formed in the opening. In this case, a similarly thin silicon oxide film 30 is also formed on the surface of the substrate on the outer side of the silicon oxide film 11.

The areas where the silicon oxide film 30 is formed correspond to the periphery of the pellet which is separated from the wafer.

Further, the silicon oxide film 14 is selectively etched such that the area of the surface of the substrate where a drain contact is to be arrayed is exposed. Thereafter, polycrystalline silicon is deposited on the surface of the substrate by the chemical vapor deposition (CVD) method, followed by patterning by way of photolithographic technique, thereby to form a polycrystalline silicon layer 17 for drain wiring, a polycrystalline silicon layer 18 for gate, and a polycrystalline silicon layer 19 for wiring, each having a thickness of about 4000 Å.

(b) The silicon oxide film 14 and the silicon oxide film 30 are removed by etching such that only a portion of the silicon oxide film 14 is left beneath the polycrystalline silicon layer 18. Thereafter, in order to form a predetermined resistor, an insulating film 20 for masking of a thickness of about 3000 Å is formed on a portion of the polycrystalline silicon layer 17 for drain wiring. The insulating film 20 for masking works to interrupt the introduction of impurities in the next step of introducing impurities, and is formed by patterning an oxide film according to a desired resistance pattern after the silicon oxide has been deposited by the chemical vapor deposition (CVD) method. According to the present invention, an insulating film 31 for masking consisting of a silicon oxide is selectively formed on the portions on the surface of the substrate where the electrode layer is to be formed by way of resistance-forming mask patterning, CVD treatment and photolithographic treatment.

(c) Donor impurities are selectively introduced into the surface of the substrate by the diffusion or ion implantation to form N+-type drain region 21, N+-type source region 22, N+-type guard ring region 23 and N+-type peripheral region 24. In the step of introducing impurities, the polycrystalline silicon layers 17, 18 and 19 are also highly doped with impurities. The portions doped with impurities have sufficiently decreased resistance so as to serve as electrodes or wirings. However, the portions covered with the insulating film 20 for masking the polycrystalline silicon layer 17 are not doped with impurities. These portions have high resistance and serve as load resistors for the transistors.

(d) An interlayer insulating film 25 of a thickness of about 6000 Å composed of a phosphorus silicate glass (PSG) or the like is deposited on the surface of the substrate by the chemical vapor deposition (CVD) method. Contact holes 26a and 26b are formed by the selective etching using the photoresist as a mask, such that portions of the source region 22, guard ring region 23 and peripheral region 24 are exposed. At the same time, the insulating film 31 is removed to expose the portions of the substrate where the substrate electrode is to be formed. The etching treatment at this time can be finished within very short periods of time since the silicon oxide film 31 formed by the CVD method has a thickness about one-third that of the field oxide film 12, permitting the etching to be carried out at a rate increased by about 4 to 5 times.

(e) Simultaneously with the formation of a source wiring layer 28 made of aluminum, a substrate electrode layer 29 of aluminum is formed on the exposed portions on the surface of the substrate.

Figure 2:
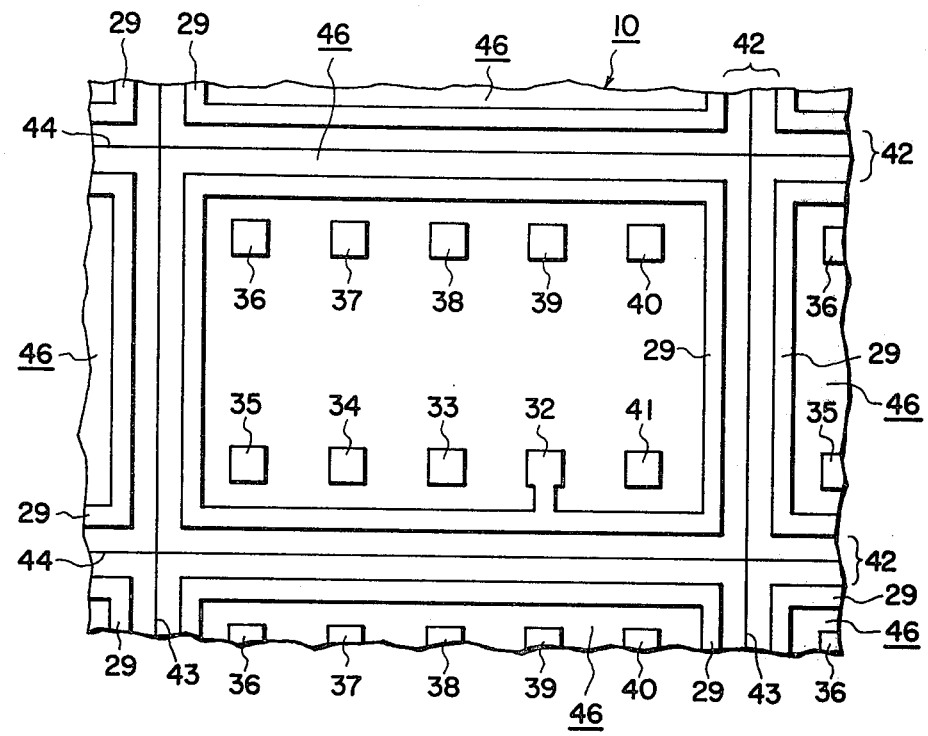
FIG. 2 is a plan view schematically showing an MOSIC which illustrates the substrate electrode formed by the method of the present invention as illustrated in FIGS. 1a to 1e.

As illustrated in FIG. 2, the substrate electrode layer 29 is so formed as to surround the periphery of the individual pellets 46 formed on a silicon wafer 10. The substrate electrode 29 is connected to a wire bonding pad 32 which is electrically connected to an outgoing lead wire of the IC package. Like other wire bonding pads 33 to 41 for supplying electric power and for introducing and producing electric signals, the wire bonding pad 32 for the substrate electrode is provided on the surface of the semiconductor substrate 10. The above-mentioned N+-type doped region 24 is formed on the surface of a scribe area 42 which is formed between the neighbouring pellets 46. The surface of the doped region 24 is scribed in the vertical and lateral directions along straight lines 43 and 44 using a scribing device such as diamond cutter, so that the wafer 10 is separated into individual pellets. In this case, the substrate electrode 29 is so patterned as will not cover the scribe area 42, in order that the pellets are not cracked during the scribing.

The N+-type regions 23 and 24 which are so provided as to surround the pellets along the substrate electrode 29 work to prevent the infiltration of contaminants such as sodium ions from the aluminum electrode 29 to the neighbouring field silicon oxide layer 11.

Figure 3:
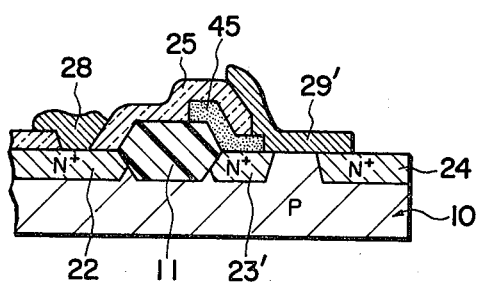
FIG. 3 is a cross-sectional view which illustrates another embodiment of the method of forming substrate electrode according to the present invention.

In order to completely prevent the infiltration of contaminants such as sodium ions from the substrate electrode 29 of aluminum to the field oxide layer 11, a guard ring layer 45 of polycrystalline silicon is so provided as to cover a bird beak portion of the field oxide layer 11 as illustrated in FIG. 3. The guard ring layer 45 of polycrystalline silicon is formed together with the wiring layer 17 of polycrystalline silicon, and an N+-type region 23' is subjected to the doping through the polycrystalline silicon layer 45 simultaneously with the phosphorus doping for forming the N+-type source and drain regions. The substrate electrode 29' of aluminum is so formed as to come into contact with the polycrystalline silicon layer 45, whereby the potential of the polycrystalline silicon layer 45 is maintained at the substrate potential.

With the above-mentioned construction, the contaminants are prevented from being infiltrated into the bird beak of the field oxide layer 11, and the electrode 45 acquires the substrate potential. It is therefore allowed to positively prevent the field oxide layer from being converted into the N-type by the spilling charge.

According to the present invention as will be obvious from the foregoing description, the mask 31 for forming the substrate electrode is formed simultaneously with the formation of the mask 20 for forming the resistor, and the mask 31 for forming the substrate electrode is removed during the step of forming contact holes for the second insulating film 25 after the impurities have been doped. Consequently, it is allowed to form the substrate electrode without modifying the conventional steps.

The present invention can be variously modified within a scope which does not depart from the spirit of the invention.

In the aforementioned invention, although a silicon oxide was used as a mask 20 for forming resistors and as a mask 31 for forming substrate electrodes, it is also allowable to use a photoresist layer as the mask when the ion-implantation method is to be employed. The mask of photoresist can be very easily removed after the ions have been implanted.

What is claimed is:

1. In a method of producing silicon gate-type MOS integrated circuit devices having polycrystalline silicon resistance, comprising:
   a step for forming a field oxide on the main surface of a silicon semiconductor substrate so as to surround areas where transistors are to be formed;
   a step for forming a gate oxide having a thickness smaller than that of said field oxide;
   a step for forming an elongated strip of polycrystalline silicon which extends from an area selected from said areas onto said field oxide;
   a step for forming a first masking layer on the surface of said elongated strip thereby to form a resistor region in said elongated strip;
   a step for introducing impurities of a conductivity type opposite to that of said semiconductor substrate into the surface of said elongated strip exposed from said first masking layer and into the selected surfaces of said areas; and
   a step for forming a first metal layer which comes into contact with said areas into which are introduced said impurities; the improvement characterized by;

forming a second masking layer on the peripheral surface of said silicon semiconductor substrate such that said impurities will not be introduced into said peripheral surfaces, said second masking layer being formed during said step for forming said first masking layer; and forming a second metal layer on said peripheral surfaces of said silicon semiconductor substrate into which are not introduced said impurities, said second metal layer being formed during said step for forming said first metal layer, thereby to form a substrate electrode of said silicon semiconductor substrate.

2. A method according to claim 1, wherein said field oxide is formed on the periphery of said silicon semiconductor substrate on the inner side of said second metal layer along said second metal layer.

3. A method according to claim 2, wherein a second semiconductor region is formed on the surface of said semiconductor substrate between said second metal layer and said field oxide formed on the periphery of said semiconductor substrate on the inner side of said second metal layer, said second semiconductor region having the conductivity type opposite to that of said semiconductor substrate.

4. A method according to claim 3, wherein a conductive layer of polycrystalline silicon which extends from said second semiconductor region to the surface of said field oxide, is formed along the field oxide which surrounds the periphery of said semiconductor substrate, said conductive layer of polycrystalline silicon being formed during said step for forming said elongated strip of polycrystalline silicon.

5. A method according to any one of claims 1 to 4, wherein said semiconductor substrate is scribed on the peripheral surface of said semiconductor substrate on the outer side of said second metal layer.

* * * * *